(12) United States Patent
Shiraiwa et al.

(10) Patent No.: US 7,151,293 B1
(45) Date of Patent: Dec. 19, 2006

(54) SONOS MEMORY WITH INVERSION BIT-LINES

(75) Inventors: Hidehiko Shiraiwa, San Jose, CA (US); Jaeyong Park, Sunnyvale, CA (US); Satoshi Torii, Sunnyvale, CA (US); Hideki Arakawa, Yokohama (JP); Masaru Yano, Kodaira (JP)

(73) Assignee: Spansion, LLC, Sunnyvale, CA (US)

( * ) Notice: Subject to any disclaimer, the term of this patent is extended or adjusted under 35 U.S.C. 154(b) by 0 days.

(21) Appl. No.: 10/928,582

(22) Filed: Aug. 27, 2004

(51) Int. Cl.
  *H01L 29/72* (2006.01)
(52) U.S. Cl. .................. 257/314; 257/319; 257/321; 257/322; 257/324; 257/330; 257/401; 365/185.15; 365/185.28; 365/185.33
(58) Field of Classification Search ............. 257/314, 257/319, 321, 322, 324, 330, 401; 365/185.15, 365/185.28, 185.33
See application file for complete search history.

(56) References Cited

U.S. PATENT DOCUMENTS 6,555,866 B1 *  4/2003  Kuo ........................... 257/314
6,911,691 B1 *  6/2005  Tomiie et al. ............... 257/324
2004/0232470 A1 *  11/2004  Zheng et al. ............... 257/311
2005/0219900 A1 *  10/2005  Kamagaki et al. ..... 365/185.14

OTHER PUBLICATIONS

*A Novel 2-Bit/Cell MONOS Memory Device with a Wrapped-Control-Gate Structure that Applies Source-Side Hot-Electron Injection*, Hideto Tomiya et al., 2002 IEEE Symposium on VLSI Technology Digest of Technical Papers.
*90-nm-node Multi-Level AG-AND Type Flash Memory with Cell Size of True 2 $F^2$/bit and Programming throughput of 10MB/S*, Y. Sasago et al., 2003 IEEE.

* cited by examiner

*Primary Examiner*—Edward Wojciechowicz
(74) *Attorney, Agent, or Firm*—Monica H. Choi (57) ABSTRACT

A SONOS memory cell, formed within a semiconductor substrate, includes a bottom dielectric disposed on the semiconductor substrate, a charge trapping material disposed on the bottom dielectric, and a top dielectric disposed on the charge trapping material. Furthermore, the SONOS memory cell includes a word-line gate structure disposed on the top dielectric and at least one bit-line gate for inducing at least one inversion bit-line within the semiconductor substrate.

20 Claims, 9 Drawing Sheets

SONOS MEMORY WITH INVERSION BIT-LINES

TECHNICAL FIELD

The present invention relates generally to non-volatile memory, and more particularly, to SONOS (semiconductor oxide nitride oxide semiconductor) memory with inversion bit-lines for eliminating diffusion bit-lines.

BACKGROUND OF THE INVENTION

Figure 1:
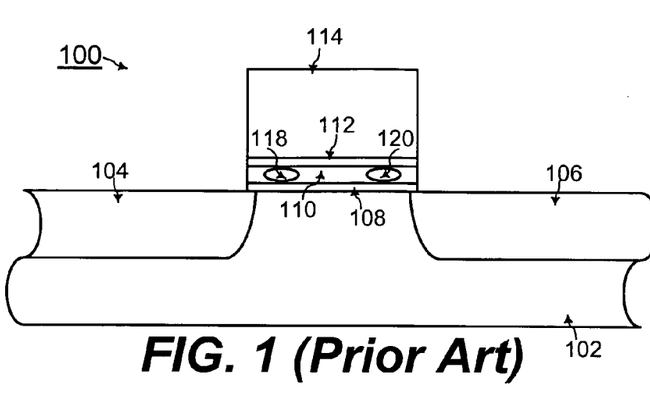
FIG. 1 shows a cross-sectional view of a conventional SONOS (semiconductor oxide nitride oxide semiconductor) memory cell.

FIG. 1 shows a conventional SONOS (semiconductor oxide nitride oxide semiconductor) memory cell 100 formed on a semiconductor substrate 102. The SONOS memory cell 100 includes a source bit-line junction 104 and a drain bit-line junction 106 formed within the semiconductor substrate 102. For example, the semiconductor substrate 102 may be a P-well formed within a silicon wafer with the bit-line junctions 104 and 106 having N-type dopant therein.

The SONOS memory cell 100 also includes a stack of a bottom dielectric 108 (typically comprised of silicon dioxide $SiO_2$), an intermediate dielectric 110 (typically comprised of silicon nitride SiN), and a top dielectric 112 (typically comprised of silicon dioxide $SiO_2$). A control gate structure 114 typically comprised of polysilicon is disposed on the top dielectric 112.

For storing a first digital bit, the substrate 102, the bit-line junctions 104 and 106, and the control gate structure 114 are appropriately biased for storing charge within a first charge storing region 118. The bias on the source and drain bit-line junctions 104 and 106 are then reversed for storing charge within a second charge storing region 120. In this manner, the SONOS memory cell 100 is a "multi-bit" memory cell storing multiple data bits.

An array of such SONOS memory cells is formed for a SONOS memory device. The area of such an array of SONOS memory cells is desired to be minimized for attaining higher data density of the SONOS memory device. However, the diffusion bit-line junctions 104 and 106 limit the lowest achievable area of the SONOS memory device. The bit-line junctions 104 and 106 further diffuse from thermal processes during fabrication of the SONOS memory device.

In addition, with diffusion bit-line junctions 104 and 106 for the prior art SONOS memory cell 100 of FIG. 1, contacts are formed onto the diffusion bit-line junctions between the word-lines within a core region having an array of such SONOS memory cells. Such higher number of contacts formed within the core region disadvantageously increases the area of the core region in the prior art. Furthermore, in the prior art array of SONOS memory cells of FIG. 1, STI (shallow trench isolation) structures are used to electrically isolated diffusion bit-line junctions of adjacent SONOS memory cells. Such STI structures disadvantageously add to the area occupied by the array of SONOS memory cells of the prior art.

Nevertheless, the area of the array of SONOS memory cells is desired to be minimized for attaining higher data density.

SUMMARY OF THE INVENTION

Accordingly, in a general aspect of the present invention, a SONOS memory cell is formed with inversion bit-lines instead of diffusion bit-line junctions.

A SONOS memory cell is formed within a semiconductor substrate according to one embodiment of the present invention. The SONOS memory cell includes a bottom dielectric disposed on the semiconductor substrate, a charge trapping material disposed on the bottom dielectric, and a top dielectric disposed on the charge trapping material. Furthermore, the SONOS memory cell includes a word-line gate structure disposed on the top dielectric and at least one bit-line gate for inducing at least one inversion bit-line within the semiconductor substrate.

In one example embodiment of the present invention, the at least one bit-line gate includes a first bit-line gate for inducing a source inversion bit-line within the semiconductor substrate, and a second bit-line gate for inducing a drain inversion bit-line within the semiconductor substrate.

In a further embodiment of the present invention, a third bit-line gate is disposed between the first and second bit-line gates for inducing a conductive path from the first inversion bit-line to the second inversion bit-line, during source side injection programming.

In yet another embodiment of the present invention, the charge trapping material includes a first charge trapping structure electrically isolated and disposed along a first side of the word-line gate structure, and a second charge trapping structure electrically isolated and disposed along a second side of the word-line gate structure.

In another embodiment of the present invention, each of the bit-line gates are formed within a respective trench of the semiconductor substrate. Alternatively, the word-line gate structure is formed within a trench of the semiconductor substrate.

In a further embodiment of the present invention, at least one of the top dielectric, the charge trapping material, and the bottom dielectric is comprised of a respective high-k dielectric material having a dielectric constant higher than that of silicon dioxide ($SiO_2$).

In yet another embodiment of the present invention, a contact junction is formed under a portion of the bit-line gate that is outside of a core region of a memory device comprised of the SONOS memory cells of the embodiments of the present invention.

In this manner, the diffusion bit-lines of the SONOS memory cells are eliminated for further scaling down of the SONOS memory device. Because inversion bit-lines are used, contacts to diffusion bit-lines and STI (shallow trench isolation) structures within the core region of the SONOS memory device are eliminated for further scaling down the area of the core region.

These and other features and advantages of the present invention will be better understood by considering the following detailed description of the invention which is presented with the attached drawings.

The figures referred to herein are drawn for clarity of illustration and are not necessarily drawn to scale. Elements having the same reference number in FIGS. 1, 2, 3, 4, 5, 6, 7, 8, 9, 10, 11, and 12 refer to elements having similar structure and function.

DETAILED DESCRIPTION

Figure 2:
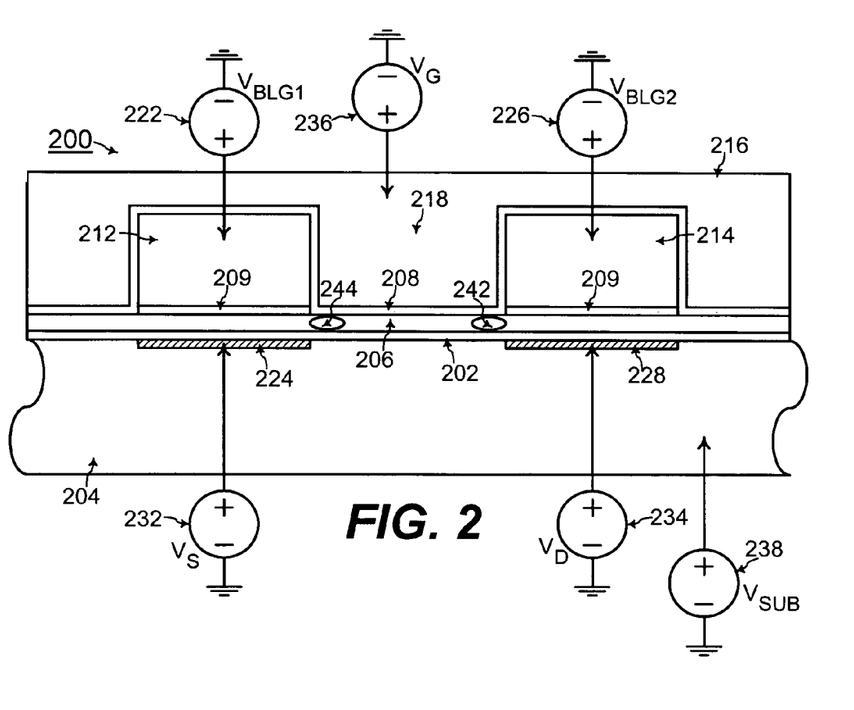
FIG. 2 shows a cross-sectional view of a SONOS memory cell with inversion bit-lines, according to an embodiment of the present invention.

FIG. 2 shows a cross-sectional view of a SONOS memory cell 200 with inversion bit-lines according to an embodiment of the present invention. The SONOS memory cell 200 includes a bottom dielectric 202 formed on a semiconductor substrate 204. The bottom dielectric 202 is comprised of silicon dioxide ($SiO_2$) or a high-k dielectric having a dielectric constant higher than that of silicon dioxide ($SiO_2$), in one embodiment of the present invention. The semiconductor substrate 204 may be a P-well formed in a silicon wafer, in one embodiment of the present invention.

A charge trapping material 206 is formed on the bottom dielectric 202. The charge trapping material 206 is comprised of silicon nitride (SiN) or a high-k dielectric having a dielectric constant higher than that of silicon dioxide ($SiO_2$), in one embodiment of the present invention. Alternatively, the charge trapping material 206 is comprised of a nano-crystal material or other types of material suited for trapping charge carriers therein. A nano-crystal material is comprised of small crystals of conductive material dispersed within a dielectric.

In addition, a first portion of top dielectric 208 is formed on bit line gates 212 and 214 and on the charge trapping material 206, and a second portion of top dielectric material 209 is formed under the bit line gates 212 and 214 and on the charge trapping material 206. Typically, the second portion of the top dielectric material 209 are formed first with patterning of the bit line gates 212 and 214, and then the first portion of the top dielectric 208 is subsequently deposited after the patterning of the bit line gates 212 and 214.

The top dielectrics 208 and 209 are comprised of silicon dioxide ($SiO_2$) or a high-k dielectric having a dielectric constant higher than that of silicon dioxide ($SiO_2$), in one embodiment of the present invention. The SONOS memory cell 200 of FIG. 2 also includes the first bit-line gate 212 formed on a portion of the top dielectric 209 and the second bit-line gate 214 formed on another portion of the top dielectric 209.

The first portion of the top dielectric 208 is formed over the bit-line gates 212 and 214. A word-line 216 is formed on the first portion of the top dielectric 208 over the bit-line gates 212 and 214. The first portion of the top dielectric 208 electrically isolates the word-line 216 from the bit-line gates 212 and 214. A portion of the word-line 216 disposed between the bit-line gates 212 and 214 forms a word-line gate structure 218 of the SONOS memory cell 200. The bit-line gates 212 and 214 and the word-line 216 are comprised of polysilicon, in one embodiment of the present invention.

For operation such as programming of the SONOS memory cell 200, a first voltage source 222 is coupled to the first bit-line gate 212. A first bit-line gate voltage $V_{BLG1}$ from the first voltage source 222 is applied on the first bit-line gate 212 for inducing a first inversion bit-line 224 in the semiconductor substrate 204 below the first bit-line gate 212. Similarly, a second voltage source 226 is coupled to the second bit-line gate 214. A second bit-line gate voltage $V_{BLG2}$ from the second voltage source 226 is applied on the second bit-line gate 214 for inducing a second inversion bit-line 228 in the semiconductor substrate 204 below the second bit-line gate 214. In an example embodiment of the present invention, the first inversion bit-line 224 forms a source inversion bit-line, and the second inversion bit-line 228 forms a drain inversion bit-line, for the SONOS memory cell 200.

Furthermore, a third voltage source 232 is coupled to the first inversion bit-line 224 for applying a source bias voltage $V_S$ thereon, and a fourth voltage source 234 is coupled to the second inversion bit-line 228 for applying a drain bias voltage $V_D$ thereon. In addition, a fifth voltage source 236 is coupled to the word-line 216 for applying a gate bias voltage $V_G$ thereon, and a sixth voltage source 238 is coupled to the semiconductor substrate 204 for applying a substrate voltage $V_{SUB}$ thereon.

In one example embodiment of the present invention, for channel hot electron (CHE) programming, the source bias voltage $V_S$ is 0 Volts, the drain bias voltage $V_D$ is 5 Volts, the gate bias voltage $V_G$ is 10 Volts, and the bit-line gate voltages $V_{BLG1}$ and $V_{BLG2}$ are in a range of 5–7 Volts. With such voltages, negative charge carriers are stored into a first charge storing region 242 within the charge trapping material 206 during CHE programming of the SONOS memory cell 200. Alternatively, when the voltage levels for the source bias voltage $V_S$ and the drain bias voltage $V_D$ are reversed, negative charge carriers are stored into a second charge storing region 244 within the charge trapping material 206 during CHE programming of the SONOS memory cell 200.

In the case hot junctions cannot be formed with the inversion bit-lines 224 and 228, source side injection programming is performed instead of CHE programming as will be described later herein. In addition, erasing for the SONOS memory cells according to embodiments of the present invention will also be described later herein.

Figure 3:
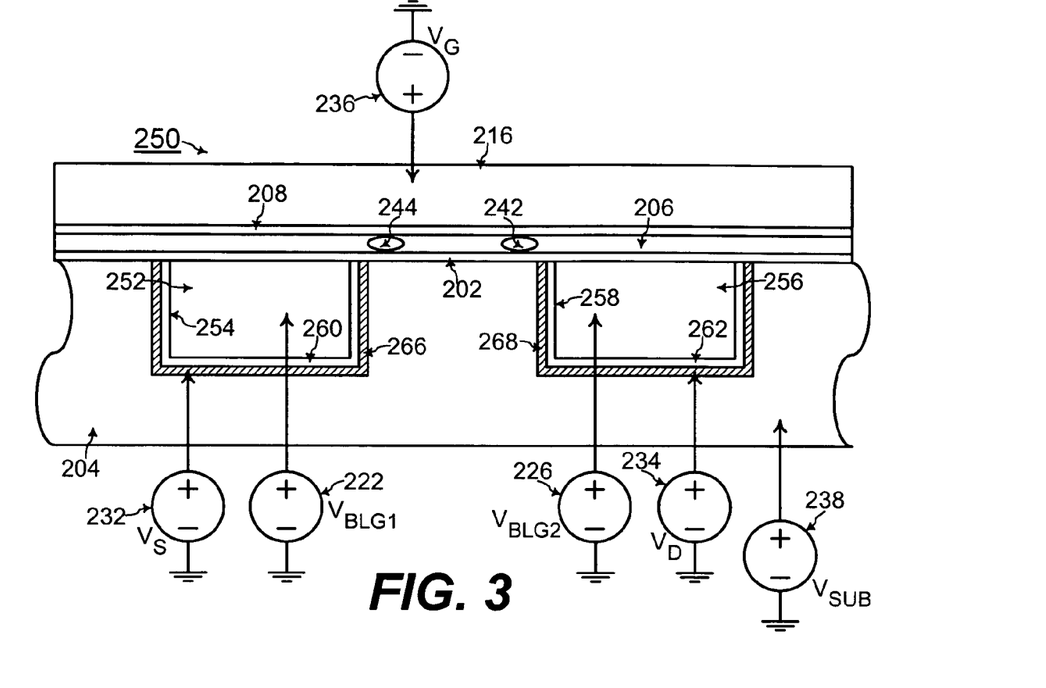
FIG. 3 shows a cross-sectional view of a SONOS memory cell with inversion bit-lines formed around trenches, according to another embodiment of the present invention.

FIG. 3 shows a cross-sectional view of a SONOS memory cell 250 with inversion bit-lines according to another embodiment of the present invention. Elements having the same reference number in FIGS. 2 and 3 refer to elements having similar structure and function. For example, the bottom dielectric 202, the charge trapping material 206, and the top dielectric 208 are formed onto the semiconductor substrate 204. In addition the voltage sources 222, 226, 232, 234, 236, and 238 and the charge storing regions 242 and 244 are similar as described in reference to FIG. 2.

In FIG. 3, a first bit-line gate 252 is formed within a first trench 254 in the semiconductor substrate 204, and a second bit-line gate 256 is formed within a second trench 258 in the semiconductor substrate 204. A first liner dielectric 260 is formed on the walls of the first trench 254 to electrically isolate the first bit-line gate 252 from the semiconductor substrate 204. Similarly, a second liner dielectric 262 is formed on the walls of the second trench 258 to electrically isolate the second bit-line gate 256 from the semiconductor substrate 204. The first and second bit-line gates 252 and 256 are comprised of polysilicon, and the first and second liner dielectrics 260 and 262 are comprised of silicon dioxide ($SiO_2$), in one embodiment of the present invention.

Further referring to FIG. 3, when the bit-line gate voltages $V_{BLG1}$ and $V_{BLG2}$ are applied on the bit-line gates 252 and 256, a first inversion bit-line 266 is formed around the sides of the first trench 254, and a second inversion bit-line 268 is formed around the sides of the second trench 258. The inversion bit-lines 266 and 268 which are formed on multiple surfaces around trenches 254 and 258 in FIG. 3 advantageously have higher area and thus lower resistance than the single surface bit-lines 224 and 228 of FIG. 2.

Figure 4:
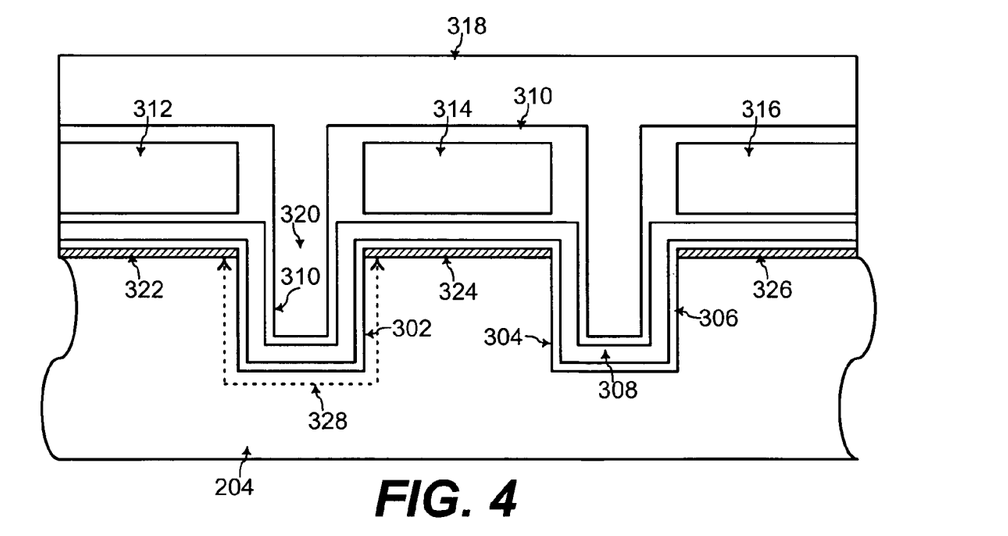
FIG. 4 shows a cross-sectional view of a SONOS memory cell with channel regions formed around trenches, according to another embodiment of the present invention.

FIG. 4 shows a cross-sectional view of SONOS memory cells with inversion bit-lines according to another embodiment of the present invention. Elements having the same reference number in FIGS. 2 and 4 refer to elements having similar structure and function. Referring to FIG. 4, a first trench 302 and a second trench 304 are formed within the semiconductor substrate 204. Thereafter, a bottom dielectric 306 is formed onto exposed surfaces including the trenches 302 and 304 of the semiconductor substrate 204. In addition, a charge trapping material 308 is formed onto the bottom dielectric 306, and a top dielectric 310 is formed onto the charge trapping material 308.

Further referring to FIG. 4, a first bit-line gate 312, a second bit-line gate 314, and a third bit-line gate 316 are formed onto the top dielectric 310. Furthermore, the top dielectric 310 is formed onto surfaces of the bit-line gates 312, 314, and 316 to electrically isolate the bit-line gates 312, 314, and 316. Thereafter, polysilicon material of a word-line 318 fills the trenches 302 and 304. The portion of the word-line 318 filling a trench 302 forms a word-line gate structure of a SONOS flash memory cell.

Additionally referring to FIG. 4, when a respective bit-line gate bias voltage is applied on each of the bit-line gates 312, 314, and 316, inversion bit-lines 322, 324, and 326, respectively, are formed within the semiconductor substrate 204 under the bit-line gates 312, 314, and 316. In FIG. 4, when the word-line gate structure 320 is formed within the trench 320, the channel length (indicated by dashed lines 328 in FIG. 4) is along the walls of the trench 302. Thus, the channel length 328 between two inversion bit-lines 322 and 324 is increased from that of the SONOS memory cell of FIG. 2. The increased channel length 328 may advantageously decrease undesired short-channel effects such a threshold voltage roll-off, leakage current, and drain induced barrier lowering.

Figure 5:
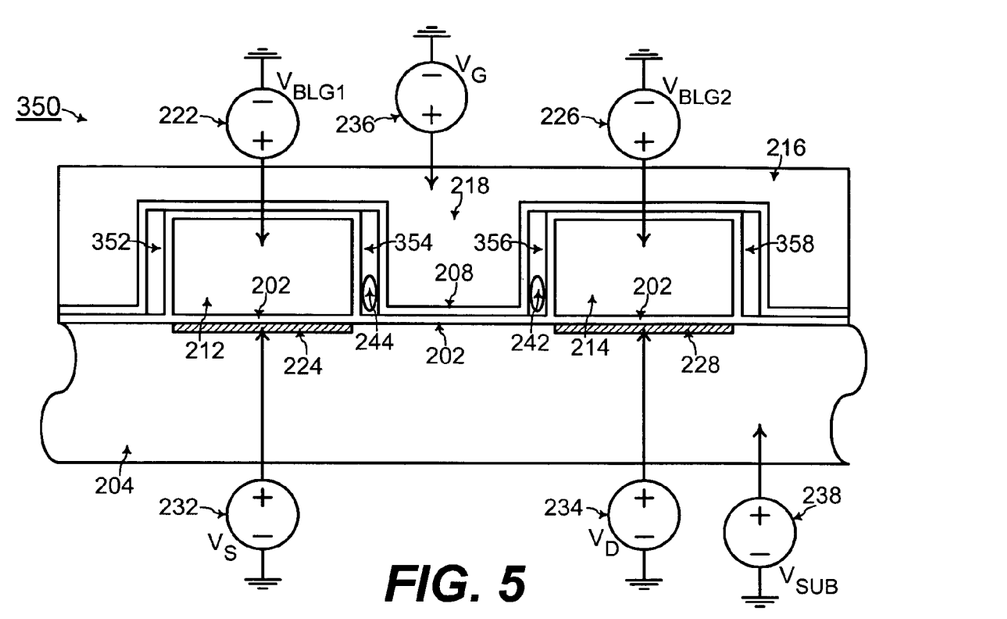
FIG. 5 shows a cross-sectional view of a SONOS memory cell with electrically isolated charge storing regions, according to another embodiment of the present invention.

FIG. 5 shows a cross-sectional view of a SONOS memory cell 350 with inversion bit-lines according to another embodiment of the present invention. Elements having the same reference number in FIGS. 2 and 5 refer to elements having similar structure and function. For example, the bottom dielectric 202 and the top dielectric 208 are formed onto the semiconductor substrate 204. In addition the voltage sources 222, 226, 232, 234, 236, and 238 are similar as described in reference to FIG. 2. However, a difference between FIGS. 2 and 5 is that charge trapping structures 352, 354, 356, and 358 comprised of the charge trapping material are formed along the sidewalls of the bit-line gates 212 and 214 in FIG. 5. In addition, each of the charge trapping structures 352, 354, 356, and 358 in FIG. 5 is electrically isolated from each other by being surrounding by the bottom and top dielectrics 202 and 208.

A respective charge storing region is formed within a charge trapping structure during programming. For example referring to FIG. 5, the first charge storing region 242 is formed within a first charge trapping structure 356 disposed toward the drain inversion bit-line 228, and the second charge storing region 244 is formed within a second charge trapping structure 354 disposed toward the source inversion bit-line 224. In FIG. 5, each of the charge trapping structures 352, 354, 356, and 358 is electrically isolated at a sidewall of the bit-lines.

Thus, undesired side effects from the amount of charge stored among any charge storing regions within the charge trapping structures 352, 354, 356, and 358 is advantageously minimized such as CBD (complementary bit disturb), in FIG. 5. The term CBD (complementary bit disturb) refers to the affect on the threshold voltage and thus the read current associated with one bit of a multi-bit SONOS memory cell from charge storage for another bit of the same multi-bit SONOS memory cell.

Figure 6:
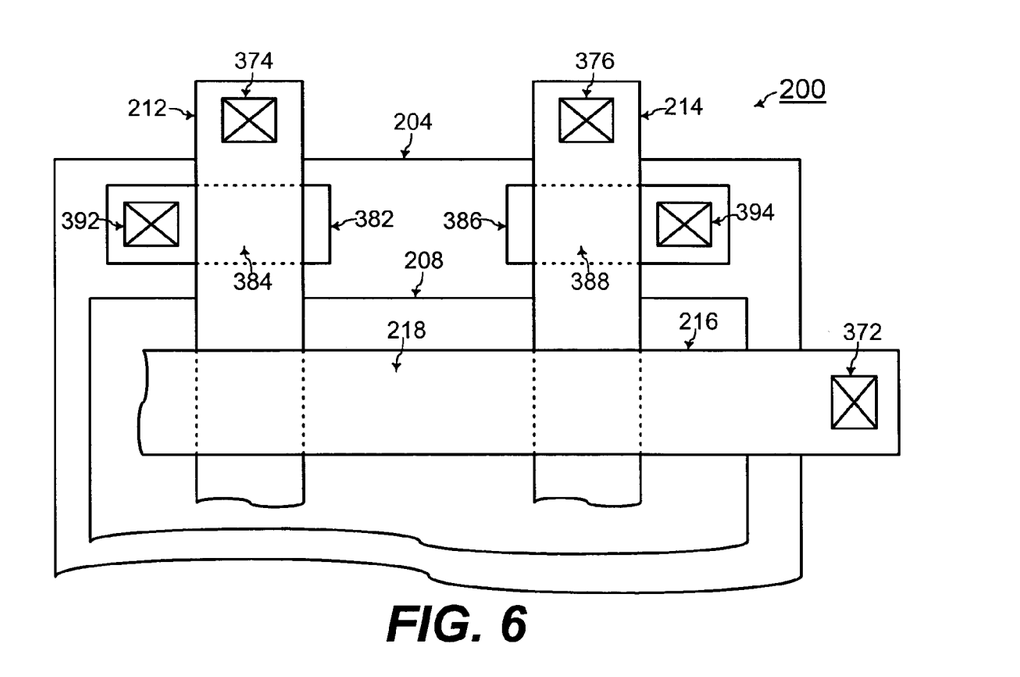
FIG. 6 shows a top view of the SONOS memory cell of FIG. 2, according to one embodiment of the present invention.

FIG. 6 shows a top view of a lay-out of the SONOS memory cell 200 of FIG. 2. The P-well 204 forms an active area which is surrounded by field oxide. The area having the top dielectric 208 formed thereon has the ONO (oxide, nitride, oxide) stack of the bottom dielectric 202, the charge trapping material 206, and the top dielectric 208. The word-line 218 is formed horizontally on top of such an ONO stack, and the bit-line gates 212 and 214 are formed vertically on top of such an ONO stack. The portion of the word-line 216 (shown between dashed lines in FIG. 6) between the bit-line gates 212 and 214 forms the word-line gate structure 218.

Furthermore, a word-line contact 372 is formed onto the word-line 216 for providing electrical contact to the word-line 216. Similarly, first and second bit-line gate contacts 374 and 376, respectively, are formed onto the bit-line gates 212 and 214, respectively, for providing electrical contact to the bit-line gates 212 and 214.

In addition, for providing coupling to the inversion bit-lines 224 and 228 formed under the bit-line gates 212 and 214, respectively, a first contact junction 382 is formed under a portion 384 of the first bit-line gate 212, and a second contact junction 388 is formed under a portion 388 of the second bit-line gate 212. A first junction contact 392 is formed onto the first contact junction 382, and a second junction contact 394 is formed onto the second contact junction 386. For example, when the inversion bit-lines 224 and 228 are formed from negative charge accumulation under the bit-line gates 212 and 214, the contact junctions 382 and 386 are formed with implantation of N-type dopant therein.

FIG. 6 has been described as the top view of the SONOS memory cell 200 of FIG. 2. However, FIG. 6 may also represent the top view of the SONOS memory cell of any of FIGS. 3, 4, and 5. Referring to FIGS. 2 and 6 for an example, the first bit-line gate voltage $V_{BLG1}$ from the first voltage source 222 is coupled to the first bit-line gate contact 374, and the second bit-line gate voltage $V_{BLG2}$ from the second voltage source 226 is coupled to the second bit-line gate contact 376.

In addition referring to FIGS. 2 and 6, the source bias voltage $V_S$ from the third voltage source 232 is coupled to the first junction contact 392, and the drain bias voltage $V_D$ from the fourth voltage source 234 is coupled to the second junction contact 394. Similarly, the gate bias voltage $V_G$ from the fifth voltage source 236 is coupled to the word-line contact 372.

Figure 7:
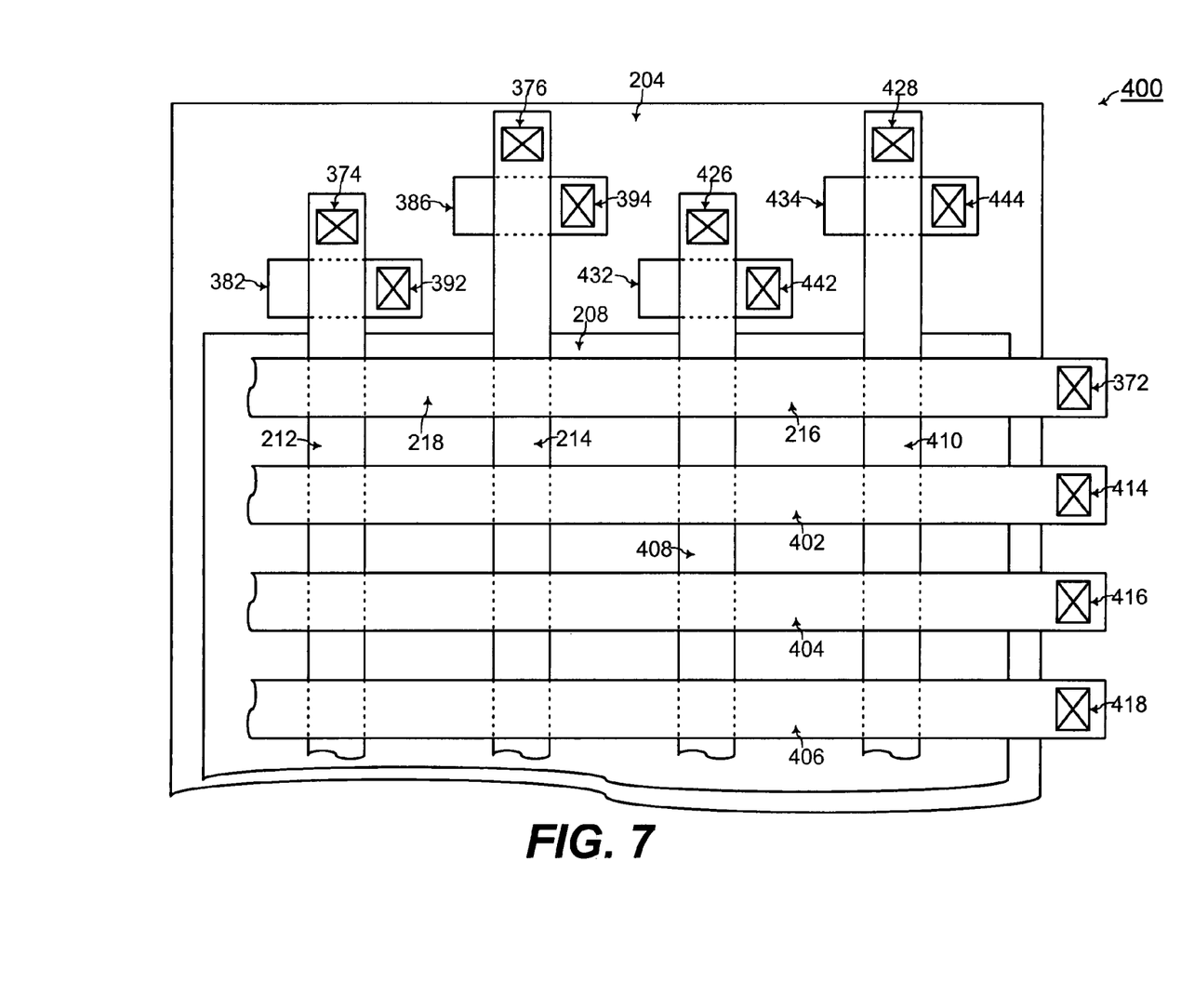
FIG. 7 shows a top view of an array of SONOS memory cells with inversion bit-lines, according to one embodiment of the present invention.

FIG. 7 shows a top view of an array 400 of SONOS memory cells formed within the active area of the semiconductor substrate 204. Field oxide is formed outside of the active area 204. The area having the top dielectric 208 formed thereon has the ONO (oxide, nitride, oxide) stack of the bottom, intermediate, and top dielectrics 202, 206, and 208. Comparing FIGS. 6 and 7, for forming the array 400 of a plurality of SONOS memory cells, a plurality of row word-lines and a plurality of column bit-lines are formed for the array 400. For example, a plurality of row word-lines 218, 402, 404, and 406 are formed horizontally on top of the ONO stack, and a plurality of column bit-lines 212, 214, 408, and 410 are formed vertically on top of the ONO stack.

Each portion (such as 218 for example) of a row word-line (such as the row word-line 216 for example) between two adjacent column bit-lines (such as column bit-lines 212 and 214 for example) forms a word-line gate structure 218. Each such word-line gate structure 218 is associated with a SONOS memory cell for forming two corresponding charge storing regions. Thus, portions of each row word-line form the word-line gate structures for a row of SONOS memory cells, and portions of each column bit-line forms the bit-line gates for a column of SONOS memory cells. FIG. 7 shows twelve SONOS memory cells for simplicity and clarity of illustration and description. However, a typical array of SONOS memory cells for a SONOS memory device would have many more SONOS memory cells.

Further referring to FIG. 7, word-line contacts 372, 414, 416, and 418 are formed onto the word-lines 218, 402, 404, and 406, respectively, for providing electrical contact to the word-lines 218, 402, 404, and 406, respectively. Similarly, bit-line gate contacts 374, 376, 426, and 428 are formed onto the bit-line gates 212, 214, 408, and 410, respectively, for providing electrical contact to the bit-line gates 212, 214, 408, and 410, respectively.

Also referring to FIG. 7, contact junctions 382, 386, 432, and 434 are formed under a portion of the bit-line gates 212, 214, 408, and 410, respectively, for coupling to the inversion bit-lines formed under the bit-line gates 212, 214, 408, and 410, respectively. In addition, junction contacts 392, 394, 442, and 444 are formed onto the contact junctions 382, 386, 432, and 434, respectively, for providing electrical contact to the contact junctions 382, 386, 432, and 434, respectively.

Referring to FIG. 7, note that the contacts 372, 374, 376, 392, 394, 414, 416, 418, 426, 428, 442, and 444 are disposed outside of the core region 208. The core region 208 is typically the area having the ONO stack formed thereon. The junction contacts 392, 394, 442, and 444 for coupling to the inversion bit-lines formed under the bit-line gates 212, 214, 408, and 410 are formed outside of the core region 208 such that the area of the core region 208 is advantageously minimized. Such junction contacts may be formed just outside of the core region 208 because the core region 208 may be formed smaller and more compactly without use of any diffusion bit lines.

In contrast, referring to the prior art of FIG. 1, with diffusion bit-line junctions 104 and 106, contacts are formed onto the diffusion bit-line junctions between the word-lines. Such significantly higher number of contacts formed within the core region disadvantageously increases the area of the core region in the prior art. Referring to the array 400 of FIG. 7, such diffusion bit-line contacts within the core region are advantageously eliminated for a much smaller area of the core region 208 with the inversion bit-lines of embodiments of the present invention.

Furthermore, in the prior art array of SONOS memory cells of FIG. 1, STI (shallow trench isolation) structures are formed within the core region to electrically isolate diffusion bit-line junctions of adjacent SONOS memory cells. Such STI structures disadvantageously add to the area occupied by the array of SONOS memory cells of the prior art. With use of inversion bit-lines instead of diffusion bit-lines, the STI structures within the core region 208 are substantially eliminated with the present invention. Such elimination of the STI structures within the core region 208 advantageously results in further scaling down of the area of the core region 208.

Figure 8:
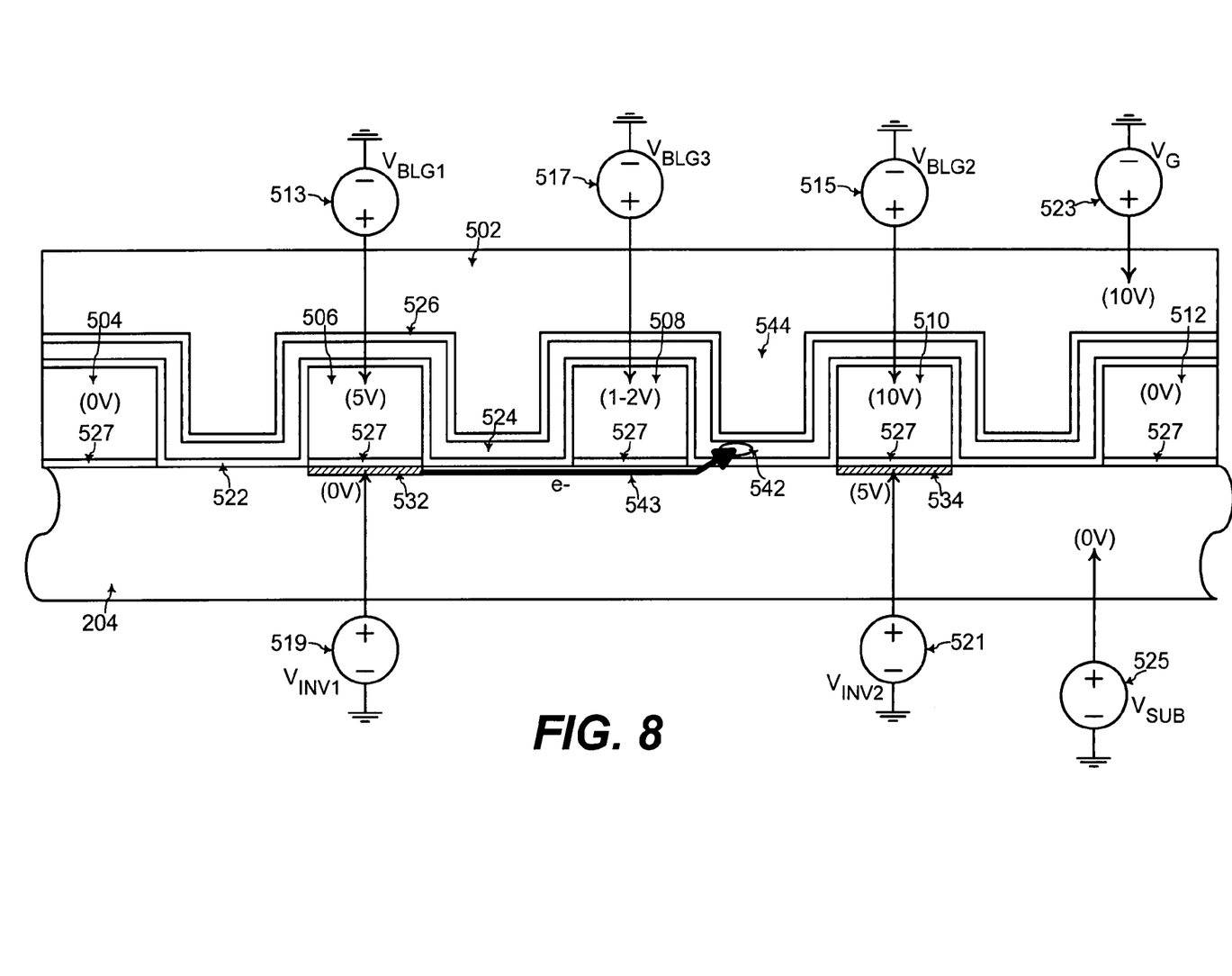
FIG. 8 shows a cross-sectional view across a row of SONOS memory cells for source side injection programming, according to an embodiment of the present invention.

FIG. 8 illustrates a cross sectional view across a word-line 502 showing the bit-line gates 504, 506, 508, 510, and 512 running there-through, with biasing for source side injection programming. In addition, a first portion of bottom dielectric 522 is formed on the bit-line gates 504, 506, 508, 510, and 512 and on the semiconductor substrate 204, and a second portion of the bottom dielectric 527 is formed under the bit-line gates 504, 506, 508, 510, and 512 on the semiconductor substrate 204. The second portion of the bottom dielectric 527 is typically formed first during patterning for the bit-line gates 504, 506, 508, 510, and 512. The first portion of bottom dielectric 522 is subsequently deposited after patterning of the bit-line gates 504, 506, 508, 510, and 512. Furthermore, a charge trapping material 524 and a top dielectric 526 are formed onto the first portion of bottom dielectric 522 in FIG. 8.

As described in reference to FIG. 2, CHE (channel hot electron) programming may be difficult to perform in the case that hot junctions cannot be formed with the inversion bit-lines 224 and 228. In that case, source side injection programming is performed instead of CHE programming. For such source side injection programming in FIG. 8, a first bit-line gate voltage, $V_{BLG1}$ (of 5 Volts for example), from a first voltage source 513 is applied on a first bit-line gate 506, and a second bit-line gate voltage, $V_{BLG2}$ (of 10 Volts for example), from a second voltage source 515 is applied on a second bit-line gate 510. Furthermore, a third bit-line gate voltage, $V_{BLG3}$ which is typically just above a threshold voltage of a third bit-line gate 508 is applied from a third voltage source 517 on the third bit-line gate 508. The third bit-line gate 508 is disposed between the first and second bit-line gates 506 and 510, and $V_{BLG3}$ is in a range of about 1–2 Volts for example.

The first and second bit-line gate voltages, $V_{BLG1}$ and $V_{BLG2}$, applied on the first and second bit-line gates 506 and 510 form first and second inversion bit-lines 532 and 534, respectively. The third bit-line gate voltage, $V_{BLG3}$, applied on the third bit-line gate 508 forms a conductive path under the third bit-line gate 508 and between the first and second inversion bit-lines 532 and 534. Additionally, the bit-line gates 504 and 512 to the other sides of the first and second bit-line gates 506 and 510 are grounded to 0 volt such that a conductive path is not formed under such outside bit-line gates 504 and 512.

Further in FIG. 8, a fourth voltage source 519 is coupled to the first inversion bit-line 532 for applying a first inversion bias voltage $V_{INV1}$ (of 0 Volt for example) thereon, and a fifth voltage source 521 is coupled to the second inversion bit-line 534 for applying a second inversion bias voltage $V_{INV2}$ (of 5 Volts for example) thereon. In addition, a sixth voltage source 523 is coupled to the word-line 502 to apply a gate bias voltage $V_G$ (of 10 Volts for example) thereon, and a seventh voltage source 525 is coupled to the semiconductor substrate 204 to apply a substrate voltage $V_{SUB}$ (of 0 Volt for example) thereon.

With such bias voltages from the voltage sources 513, 515, 517, 519, 521, 523, and 525, charge carriers (i.e., electrons) travel from the first inversion bit-line 532 toward the second inversion bit-line 534. Such a traveling charge carrier may attain enough kinetic energy to over-come the potential barrier of the bottom dielectric 522 near a charge storing region 542 disposed within the charge trapping material 524 and toward a source side of a word-line gate structure 544 disposed toward the left of the second bit-line gate 510. Such a traveling charge carrier overcomes the potential barrier of the bottom dielectric 522 and becomes stored within the charge storing region 542 during such source side injection programming (as illustrated by the emboldened path 543 from the edge of the first inversion bit-line 532 to the charge storing region 542 in FIG. 8).

Figure 9:
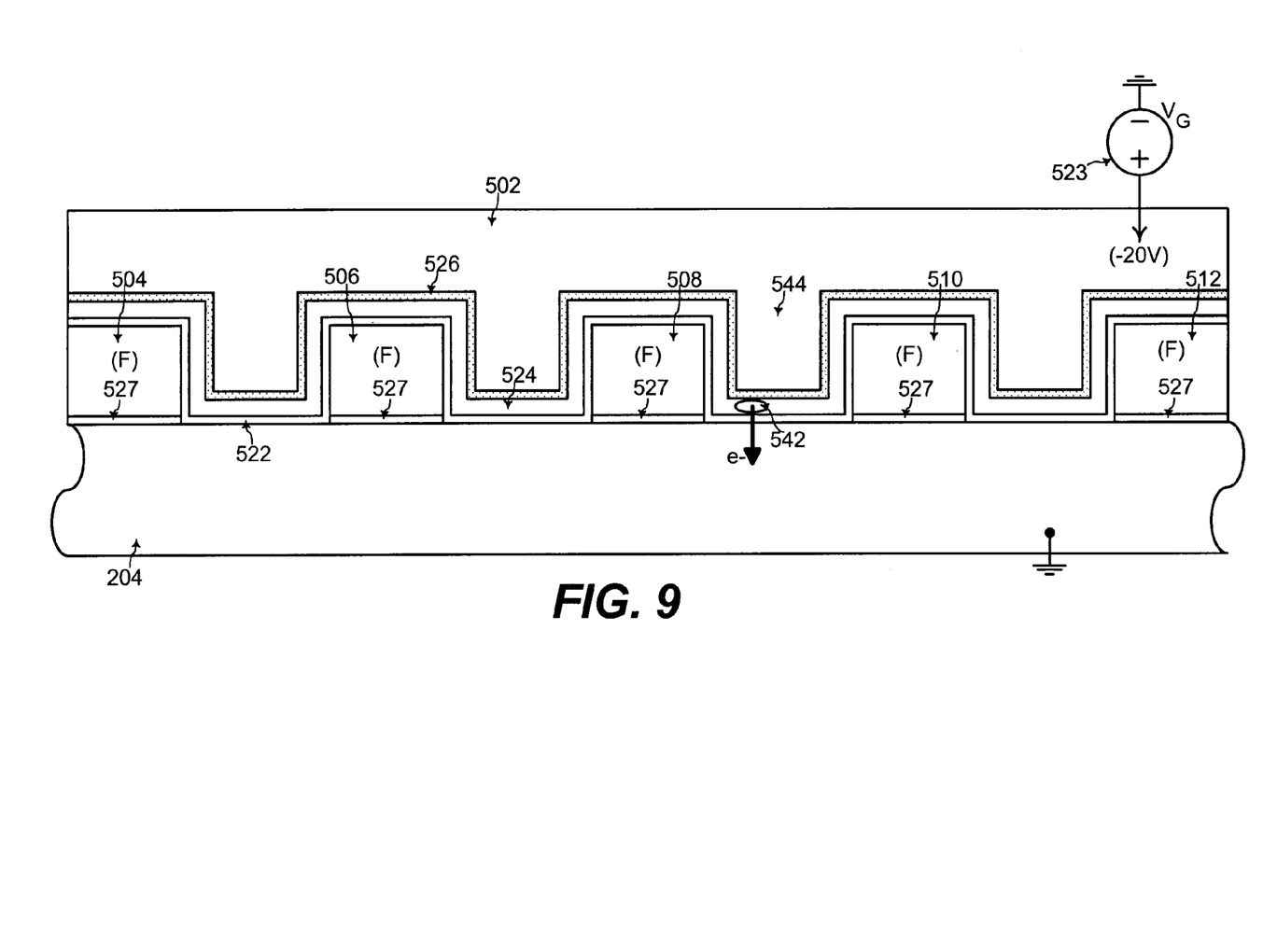
FIGS. 9 and 10 show cross-sectional views across a row of SONOS memory cells during Fowler-Nordheim erasing, according to an embodiment of the present invention.

FIG. 9 shows the bias voltages applied for FN (Fowler-Nordheim) erasing of the SONOS memory cells according to an embodiment of the present invention. Elements having the same reference number in FIGS. 8 and 9 refer to elements having similar structure and function. Referring to FIG. 9, the bit-line gates 504, 506, 508, 510, and 512 are left floating such that no inversion bit-lines are formed under the bit-line gates 504, 506, 508, 510, and 512.

Further in FIG. 9, a gate bias voltage $V_G$ of −20 Volts is applied to the word-line 502 while the substrate 204 is grounded to 0 Volts. With such a bias, the negative charge carriers stored within the charge storing region 542 are pulled to the substrate 204 with FN (Fowler-Nordheim) tunneling mechanism. In one embodiment of the present invention, the top dielectric 526 is comprised of a high-k dielectric material (i.e., a dielectric material having a dielectric constant higher than that of silicon dioxide ($SiO_2$)) in FIG. 9. Forming the top dielectric 526 with such a high-k dielectric material prevents negative charge carriers from being injected from the word-line 502 into the charge storing region 542 during the FN (Fowler-Nordheim) erase of FIG. 9.

Figure 10:
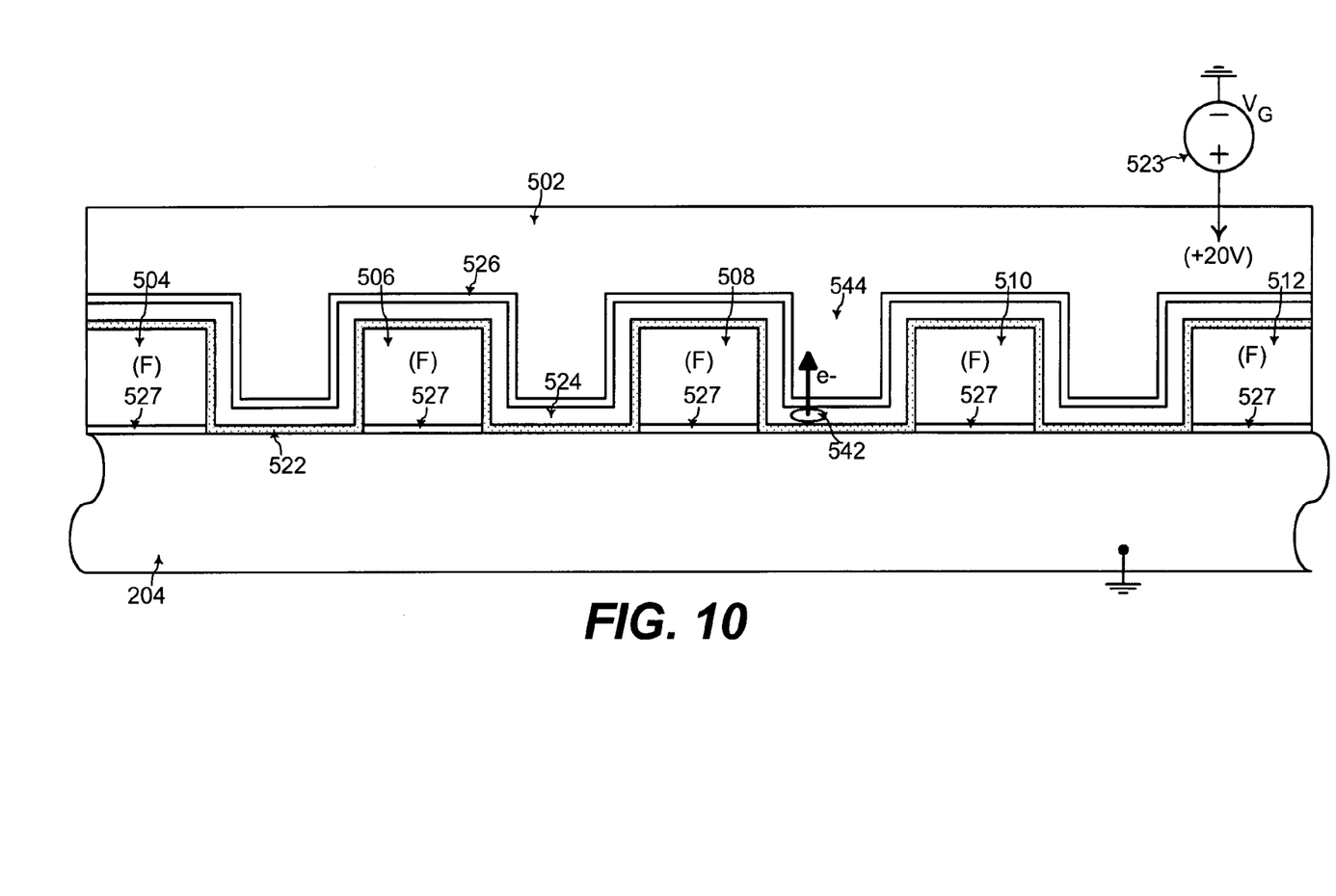

FIG. 10 shows alternative bias voltages applied for FN (Fowler-Nordheim) erasing of the SONOS memory cells of FIG. 9 according to another embodiment of the present invention. Elements having the same reference number in FIGS. 9 and 10 refer to elements having similar structure and function. Comparing FIGS. 9 and 10, a gate bias voltage $V_G$ of +20 Volts is applied to the word-line 502 (instead of the −20 Volts of FIG. 9) while the substrate 204 is grounded to 0 Volts.

With such a bias of FIG. 10, the negative charge carriers stored within the charge storing region 542 are pulled to the word-line 502 with FN (Fowler-Nordheim) tunneling mechanism. In one embodiment of the present invention, the bottom dielectric 522 is comprised of a high-k dielectric material (i.e., a dielectric material having a dielectric constant higher than that of silicon dioxide $SiO_2$) in FIG. 10. Forming the bottom dielectric 522 with such a high-k dielectric material prevents negative charge carriers from being injected from the substrate 204 into the charge storing region 542 during the FN (Fowler-Nordheim) erase of FIG. 10.

Thus, in one aspect of the present invention, at least one of the bottom dielectric 522, the charge trapping material 524, and the top dielectric 526 in any of the SONOS memory cells of FIGS. 2, 3, 4, 5, 8, 9, 10, 11, and 12 is comprised of a high-k dielectric material (i.e., a dielectric material having a dielectric constant higher than that of silicon dioxide $SiO_2$). As described in reference to FIGS. 9 and 10, when any of the bottom or top dielectrics is comprised of such a high-k dielectric material, charge carriers are prevented from being injected into charge storing regions within the charge trapping material during the FN (Fowler-Nordheim) erase.

When the charge trapping material 524 is comprised of an appropriate high-k dielectric material, affect of charge storage among adjacent charge storing regions is minimized. For example, referring to FIG. 2, when the charge trapping material 206 is comprised of an appropriate high-k dielectric material, the affect of charge storage among the adjacent charge storing regions 242 and 244 is minimized for less CBD (complementary bit disturb) between such charge storing regions 242 and 244.

In addition, when the charge trapping material is comprised of an appropriate high-k dielectric material, the retention time of charge storage within charge storing regions disposed in the charge trapping material is advantageously increased. Furthermore, when the charge trapping material is comprised of a high-k dielectric material, the EOT (effective oxide thickness) thereof is reduced for advantageously reducing the operating voltages of the SONOS memory cells.

Alternatively, the SONOS memory cells of the present invention may also be practiced when the bottom dielectric is comprised of a thin (such as 20–25 Å) layer of oxide ($SiO_2$), and with the top dielectric being comprised of a thicker (such as 70 Å) layer of oxide. In that case, during FN (Fowler-Nordheim) erase, electrons move through the bottom dielectric with direct tunneling mechanism. The charge trapping material may also be comprised of the typical material of nitride (SiN) in that case.

Figure 11:
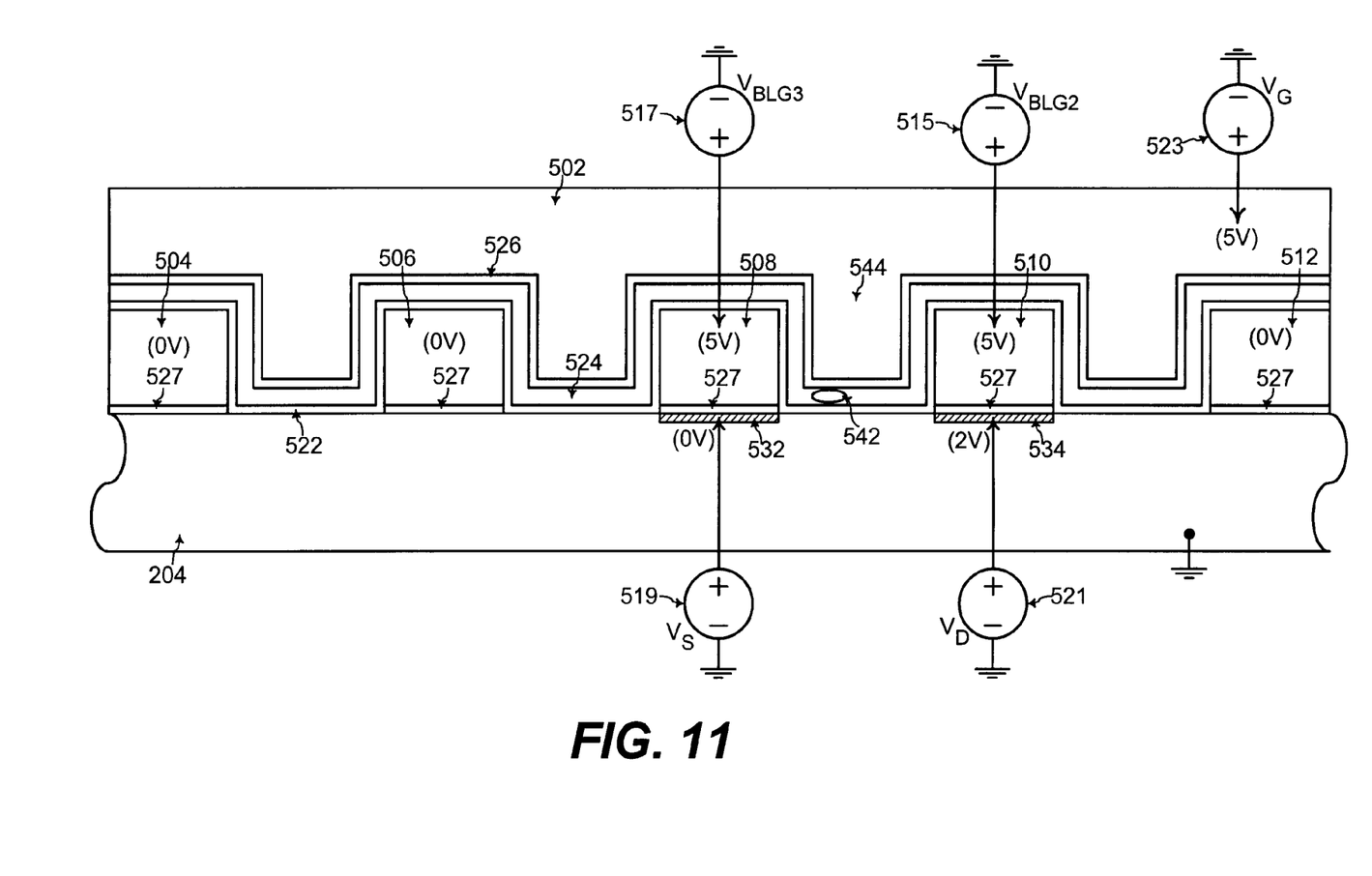
FIG. 11 shows a cross-sectional view across a row of SONOS memory cells for reading a SONOS memory cell in the row, according to an embodiment of the present invention.

FIG. 11 shows the bias voltages applied for reading of a SONOS memory cell in the row of SONOS memory cells of FIG. 8, according to an embodiment of the present invention. Elements having the same reference number in FIGS. 8 and 11 refer to elements having similar structure and function. Referring to FIG. 11, the SONOS memory cell associated with the word-line gate structure 544 is being read. The outside bit-line gates 504, 506, and 512 are grounded to 0 Volt such that no inversion bit-lines are formed under the bit-line gates 504, 506, and 512. On the other hand, bit-line gate bias voltages of 5 Volts are applied on the bit-line gates 508 and 510 disposed to the sides of the word-line gate structure 544 such that inversion bit-lines 532 and 534 are formed under the bit-line gates 508 and 510.

Further in FIG. 11, a drain bias voltage $V_D$ of 2 Volts is applied on the drain inversion bit-line 534, and a source bias voltage $V_S$ of 0 Volt is applied on the source inversion bit-line 532. At the same time, a gate bias voltage $V_G$ of 5 Volts is applied to the word-line 502 while the substrate 204 is grounded to 0 Volt. With such bias voltages, the amount of charge carriers stored within the charge storing region 542 is determined from the level of current flowing through the SONOS memory cell during the read operation of FIG. 11.

With the SONOS memory cells of FIG. 11, the drain inversion bit-line 534 is not likely to form into a hot junction during the read operation of FIG. 11. Thus, CHE (channel hot electron) injection of charge carriers into a charge storing region toward the drain inversion bit-line 534 is not likely to occur, resulting in less read disturb during the read operation of FIG. 11. Thus, the drain bias voltage $V_D$ applied on the drain inversion bit-line 534 may be increased without significant CBD (complementary bit disturb) for a more sensitive read operation in FIG. 11.

Figure 12:
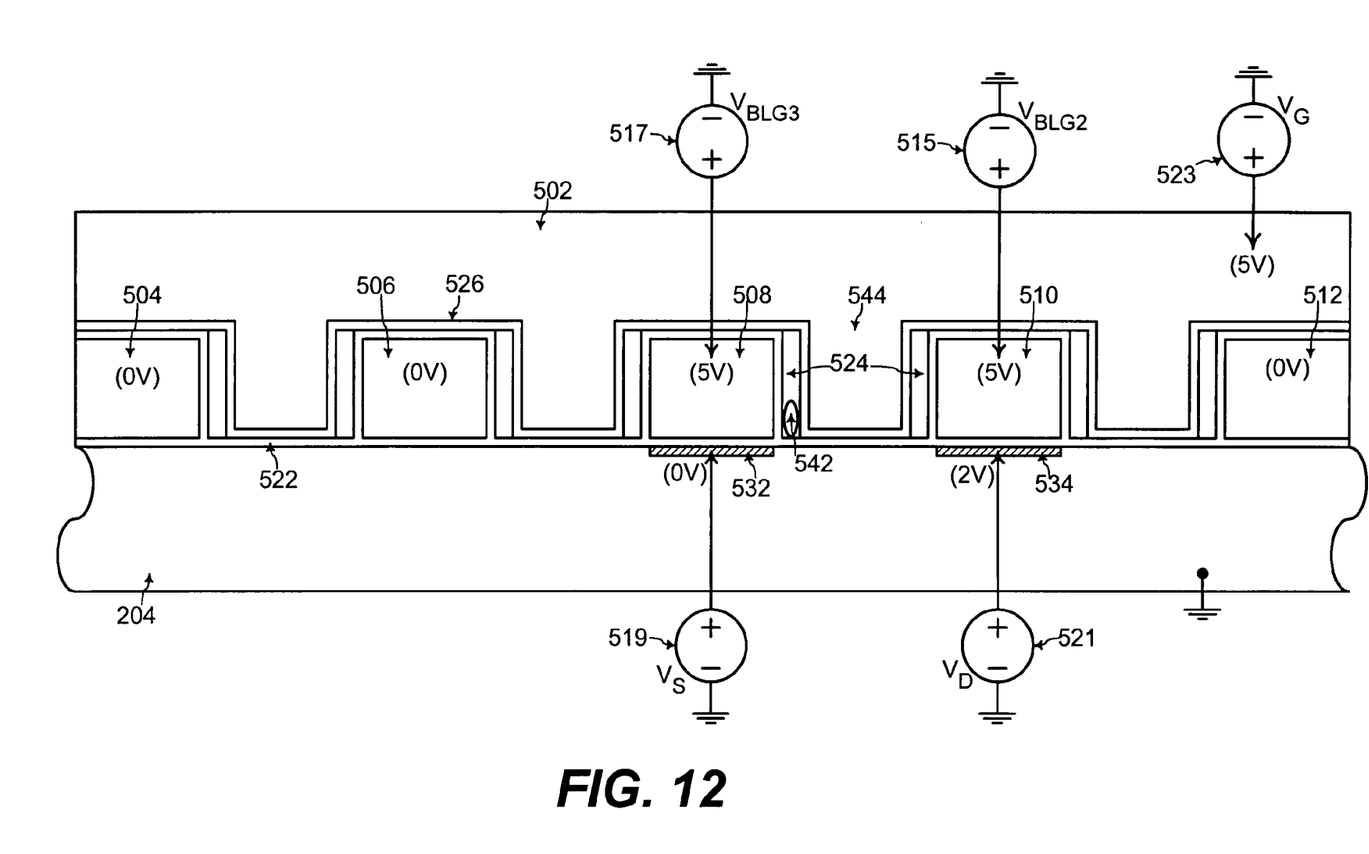
FIG. 12 shows a cross-sectional view across a row of SONOS memory cells with isolated charge trapping structures for reading a SONOS memory cell in the row, according to an embodiment of the present invention.

FIG. 12 also shows a cross-sectional view of a read operation across a row of SONOS memory cells having electrically isolated charge trapping structures 524 disposed along the sidewalls of the bit-line gates 504, 506, 508, 510, and 512. Elements having the same reference number in FIGS. 11 and 12 refer to elements having similar structure and function. Referring to FIG. 12, because the charge storing unit 542 is within the electrically isolated charge trapping structures 524, the affect of charge storage among any charge storing regions and thus CBD (complementary bit disturb) is advantageously eliminated. With such minimized CBD (complementary bit disturb) as illustrated in FIGS. 11 and 12, the array of SONOS memory cells advantageously has a tighter threshold voltage distribution.

In this manner, with the SONOS memory cells according to the before described embodiments of the present invention, inversion bit-lines are formed to eliminate diffusion bit-lines. Junctions of diffusion bit-lines tend to further diffuse out during thermal processes such that the area of the diffusion bit-lines becomes difficult to scale down beyond a minimum limit. Without diffusion bit-lines in embodiments of the present invention, the size of the SONOS memory cells using inversion bit-lines are easier to scale down. Also, the implantation and annealing steps for formation of the diffusion bit-lines are eliminated for less processing steps for forming the SONOS memory cells using inversion bit-lines according to embodiments of the present invention.

Furthermore, as discussed in reference to FIG. 7, contacts formed onto the diffusion bit-line junctions and STI structures used to electrically isolated diffusion bit-line junctions within the core region are substantially eliminated with embodiments of the SONOS memory cells of the present invention. Thus, a significantly lower area of the core region is attainable with embodiments of the SONOS memory cells of the present invention.

Additionally, as described in reference to FIG. 8, source side injection programming may be used instead of CHE (channel hot electron) programming which requires higher current. With source side injection programming, lower programming current is used for advantageously minimizing power dissipation of the SONOS memory device. In addition, as described in reference to FIGS. 5, 11, and 12, SONOS memory cells of embodiments of the present invention exhibit minimized CBD (complementary bit disturb).

Also, column leakage current is minimized during programming or read operations. For example, referring to the programming operation of FIG. 8, the outside bit-line gates 504 and 512 are appropriately biased to prevent formation of any inversion bit-line under such bit-line gates 504 and 512. Without any such inversion bit-line, leakage current through any outside bit-line (i.e., any bit-line that is not the inversion bit-lines 532 and 534) is minimized during the programming operation of FIG. 8.

Similarly, referring to the read operation of FIG. 11 or 12, the outside bit-line gates 504, 506, and 512 are appropriately biased to prevent formation of any inversion bit-line under such bit-line gates 504, 506, and 512. Without any such inversion bit-line, leakage current through any outside bit-line (i.e., any bit-line that is not the inversion bit-lines 532 and 534) is minimized during the read operation of FIG. 11 or 12. In this manner, column leakage current is minimized during the programming or read operations of FIGS. 8, 11, and 12 with the SONOS memory cells of embodiments of the present invention.

Further as described in reference to FIG. 8, source side injection programming may be performed for having the negative charge carriers attain enough kinetic energy to enter the charge storing region 542. For such source side injection programming, the three bit-line gates 506, 508, and 510 are biased with a positive voltage whereas the rest of the bit-line gates are grounded at 0 Volts such that an inversion bit-line is not formed under such rest of the bit-line gates. With such source side injection programming, the negative charge carriers are substantially just stored into the intended charge storing region 542, and charge carriers do not attain enough kinetic energy to enter into any un-intended charge storing regions.

Thus, the maximum number of times such a programming gate bias voltage of 10 Volts that may be applied on the word-line 502 (commonly termed "NOP" (number of programming)) before substantial corruption of the amount of charge stored in any un-intended charge storing regions is higher with the present invention. In addition, the programming gate bias voltage of 10 Volts is relatively low compared to other programming voltages in other types of nonvolatile memory devices such that the NOP is higher with the present invention.

The foregoing is by way of example only and is not intended to be limiting. For example, any materials specified herein are by way of example only. In addition, the source side injection programming operation in FIG. 8, the FN (Fowler-Nordheim) erasing operations in FIGS. 9 and 10, and the reading operations of FIGS. 11 and 12 are illustrated and described for example SONOS memory cells with inversion bit-lines. However, such operations may also be applied to a row of any of the embodiments of the SONOS memory cells as described herein. For example, the source side injection programming operation as described in reference to FIG. 8 may also be performed to a row of SONOS memory cells having the bit-line gates formed within trenches of the semiconductor substrate as described in reference to FIG. 3 for example.

The present invention is limited only as defined in the following claims and equivalents thereof.

We claim:

1. A SONOS memory cell formed on a semiconductor substrate, comprising:
   a bottom dielectric disposed on the semiconductor substrate;
   a top dielectric disposed on portions of the bottom dielectric;
   a word-line gate structure disposed on the top dielectric, a portion of the semiconductor substrate disposed under the word-line gate forming a channel region;
   at least one bit-line gate for inducing at least one inversion bit-line to a side of the channel region within the semiconductor substrate; and
   at least one charge trapping structure formed to be electrically isolated by being surrounded by the top and bottom dielectrics between a sidewall of the bit-line gate and a sidewall of the word-line gate structure.

2. The SONOS memory cell of claim 1, wherein the at least one bit-line gate includes:
   a first bit-line gate for inducing a source inversion bit-line to a first side of the channel region within the semiconductor substrate such that a junction is not formed for the source bit-line; and
   a second bit-line gate for inducing a drain inversion bit-line to a second side of the channel region within the semiconductor substrate such that a junction is not formed for the drain bit-line.

3. The SONOS memory cell of claim 2, wherein the at least one bit-line gate further includes:

a third bit-line gate disposed between the first and second bit-line gates for inducing a conductive path from the first inversion bit-line to the second inversion bit-line, during source side injection programming.

4. The SONOS memory cell of claim 2, further comprising:
a first charge trapping structure electrically isolated and disposed between sidewalls of the first bit-line gate and the word-line gate structure; and
a second charge trapping structure electrically isolated and disposed between sidewalls of the second bit-line gate and the word-line gate structure.

5. The SONOS memory cell of claim 1, wherein at least one of the top dielectric, the charge trapping structure, and the bottom dielectric is comprised of a respective high-k dielectric material having a dielectric constant higher than that of silicon dioxide ($SiO_2$).

6. The SONOS memory cell of claim 1, further comprising:
a contact junction formed under a portion of the bit-line gate that is outside of a core region of a memory device comprised of the SONOS memory cell.

7. The SONOS memory cell of claim 1, wherein the charge trapping structure is comprised of a nano-crystal material.

8. A SONOS memory cell formed on a semiconductor substrate, comprising:
a bottom dielectric disposed on the semiconductor substrate, a charge trapping material disposed on the bottom dielectric, and a top dielectric disposed on the charge trapping material;
a word-line gate structure disposed on the top dielectric, a portion of the semiconductor substrate disposed under the word-line gate forming a channel region; and
at least one bit-line gate filling a trench formed into the semiconductor substrate, each bit-line gate inducing an inversion bit-line at sidewalls of the trench within the semiconductor substrate.

9. The SONOS memory cell of claim 8, wherein the at least one bit-line gate includes:
a first bit-line gate filling a first trench formed into the semiconductor substrate, the first bit-line gate inducing a source inversion bit-line at sidewalls of the first trench within the semiconductor substrate such that a junction is not formed for the source bit-line; and
a second bit-line gate filling a second trench formed into the semiconductor substrate, the second bit-line gate inducing a drain inversion bit-line at sidewalls of the second trench within the semiconductor substrate such that a junction is not formed for the drain bit-line.

10. The SONOS memory cell of claim 8, wherein at least one of the top dielectric, the charge trapping material, and the bottom dielectric is comprised of a respective high-k dielectric material having a dielectric constant higher than that of silicon dioxide ($SiO_2$).

11. The SONOS memory cell of claim 8, further comprising:
a contact junction formed under a portion of the bit-line gate that is outside of a core region of a memory device comprised of the SONOS memory cell.

12. The SONOS memory cell of claim 8, wherein the charge trapping material is comprised of a nano-crystal material.

13. A SONOS memory cell formed on a semiconductor substrate, comprising:
a bottom dielectric disposed on the semiconductor substrate, a charge trapping material disposed on the bottom dielectric, and a top dielectric disposed on the charge trapping material;
a word-line gate structure disposed on the top dielectric, a portion of the semiconductor substrate disposed under the word-line gate forming a channel region;
a first bit-line gate for inducing a source inversion bit-line to a first side of the channel region within the semiconductor substrate such that a junction is not formed for the source bit-line;
a second bit-line gate for inducing a drain inversion bit-line to a second side of the channel region within the semiconductor substrate such that a junction is not formed for the drain bit-line; and
a third bit-line gate disposed between the first and second bit-line gates for inducing a conductive inversion path from the first inversion bit-line to the second inversion bit-line, during source side injection programming.

14. The SONOS memory cell of claim 13, wherein the charge trapping material includes:
a first charge trapping structure electrically isolated and disposed at a first sidewall of the word-line gate structure; and
a second charge trapping structure electrically isolated and disposed at a second sidewall of the word-line gate structure.

15. The SONOS memory cell of claim 14, wherein each of the bit-line gates is formed within a respective trench of the semiconductor substrate.

16. The SONOS memory cell of claim 13, wherein the word-line gate structure is formed within a trench of the semiconductor substrate.

17. The SONOS memory cell of claim 13, wherein at least one of the top dielectric, the charge trapping material, and the bottom dielectric is comprised of a respective high-k dielectric material having a dielectric constant higher than that of silicon dioxide ($SiO_2$).

18. The SONOS memory cell of claim 13, wherein the charge trapping material is a charge trapping structure that is electrically isolated and disposed along a side of the word-line gate structure.

19. The SONOS memory cell of claim 13, further comprising:
a contact junction formed under a portion of the bit-line gate that is outside of a core region of a memory device comprised of the SONOS memory cell.

20. The SONOS memory cell of claim 13, wherein the charge trapping material is comprised of a nano-crystal material.

* * * * *